United States Patent
Hierlemann

(10) Patent No.: US 7,358,167 B2
(45) Date of Patent: Apr. 15, 2008

(54) IMPLANTATION PROCESS IN SEMICONDUCTOR FABRICATION

(75) Inventor: Matthias Hierlemann, Fishkill, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/600,424

(22) Filed: Nov. 16, 2006

(65) Prior Publication Data

US 2007/0059907 A1    Mar. 15, 2007

Related U.S. Application Data

(62) Division of application No. 11/122,713, filed on May 5, 2005, now Pat. No. 7,172,954.

(51) Int. Cl.
*H01L 21/425* (2006.01)
(52) U.S. Cl. ............ 438/527; 438/529; 438/530; 257/E21.335
(58) Field of Classification Search .......... 438/527, 438/529, 530; 257/E21.335
See application file for complete search history.

(56) References Cited

U.S. PATENT DOCUMENTS 5,770,845 A    6/1998   Hjelmvik
5,795,808 A    8/1998   Park
5,908,307 A    6/1999   Talwar et al.
6,087,209 A    7/2000   Yeap et al.
6,333,217 B1 * 12/2001  Umimoto et al. ........... 438/197
6,380,044 B1   4/2002   Talwar et al.
6,555,439 B1   4/2003   Xiang et al.
6,680,250 B1   1/2004   Paton et al.

(Continued)

FOREIGN PATENT DOCUMENTS

WO    WO 03/063218 A3    7/2003

OTHER PUBLICATIONS

Liu, C.T., et al., "Manufacturable Shallow-Junction Processes to Overcome Defect Formation and Dopant Reactions for Sub-0.18 μm CMOS Technologies," 1997 Symposium on VLSI Technology Digest of Technical Papers, 1997, pp. 91-92.

(Continued)

*Primary Examiner*—Trung Dang
(74) *Attorney, Agent, or Firm*—Slater & Matsil, L.L.P.

(57) ABSTRACT

A semiconductor device is formed by performing an amorphizing ion implantation to implant dopants of a first conductivity type into a semiconductor body. The first ion implantation causes a defect area (e.g., end-of-range defects) within the semiconductor body at a depth. A non-amorphizing implantation implants dopants of the same conductivity type into the semiconductor body. This ion implantation step implants dopants throughout the defect area. The dopants can then be activated by heating the semiconductor body for less than 10 ms, e.g., using a flash anneal or a laser anneal.

17 Claims, 4 Drawing Sheets

U.S. PATENT DOCUMENTS

| | | |
|---|---|---|
| 6,690,071 B2 | 2/2004 | Sambonsugi et al. |
| 6,709,961 B2 * | 3/2004 | Noda .................... 438/549 |
| 6,727,136 B1 | 4/2004 | Buller et al. |
| 6,936,505 B2 | 8/2005 | Keys et al. |
| 7,064,373 B2 | 6/2006 | Goebel et al. |
| 7,071,069 B2 * | 7/2006 | Tan et al. ................ 438/306 |
| 2001/0041432 A1 | 11/2001 | Lee |
| 2003/0013260 A1 | 1/2003 | Gossmann et al. |
| 2003/0096490 A1 | 5/2003 | Borland et al. |
| 2004/0087120 A1 | 5/2004 | Feudel et al. |
| 2004/0235280 A1 | 11/2004 | Keys et al. |
| 2005/0026403 A1 | 2/2005 | Lee et al. |
| 2006/0199323 A1 * | 9/2006 | Mitsuda et al. ............ 438/197 |

OTHER PUBLICATIONS

Cowern, N.E.B., et al., "Physics-Based Diffusion Simulations for Preamorphized Ultrashallow Junctions," Proc. Materials Research Society Spring Meeting, Spring 2003, pp. 6 total.

* cited by examiner

IMPLANTATION PROCESS IN SEMICONDUCTOR FABRICATION

This application is a divisional of patent application Ser. No. 11/122,713, entitled "Implantation Process in Semiconductor Fabrication," filed on May 5, 2005 now U.S. Pat. No. 7,172,954, which application is incorporated herein by reference.

TECHNICAL FIELD

This invention relates generally to semiconductor processes, and more particularly to an implantation process in semiconductor fabrication.

BACKGROUND

Semiconductor devices are used in a large number of electronic devices such as computers, cell phones and others. One of the goals of the semiconductor industry is to continue shrinking the size of individual devices. Smaller devices can be fabricated more inexpensively (e.g., since more chips can be formed simultaneously on a single wafer) and can operate at higher speeds (e.g., since the physical distance between components is smaller). As a result, the continual shrinking of components, such as transistors, is desirable.

One process that is commonly used to form semiconductor components is ion implantation. As an example, to form the source and drain of a transistor, dopant ions are typically implanted into a semiconductor body adjacent to a gate. These dopants must then be activated using a thermal process. Any additional thermal processing will cause the dopants to diffuse within the semiconductor body. This diffusion has the consequence of limiting the size of components that include doped regions.

As the gate length is scaled down, it is becoming more and more difficult to adjust performance and leakage. Ultra shallow junctions and improved dopant activation are required. An ultra shallow dopant profile can be formed with the help of laser and flash anneals that activate the dopants without diffusing the dopant species. However, the drastically reduced thermal budget drives up junction leakage since it prevents the annealing of defects, mostly end-of-range (EoR) defects, and leads to extremely hard junctions, which increase band-to-band tunneling (BTBT) and impact ionization (II).

SUMMARY OF THE INVENTION

In one aspect, the present invention provides an implant scheme that utilizes a main implant (pre-amorphization, species and co-implants) combined with a weak non-amorphizing "softening" implant (same or different species, with or without co-implant) placed slightly beyond the main implant. This softening implant moves, partly or fully, EoR defects within the junction, thereby removing them from the most critical location for leakage at the junction interface. Due to its non-amorphizing property, the softening implant will have slight diffusion (like a diffusion tail) that smoothens the junction and reduces band-to-band tunneling and impact ionization. Both effects reduce junction leakage. In optimized application, the overall increase in junction depth should be small.

In one embodiment, a semiconductor device is formed by performing an amorphizing ion implantation to implant dopants of a first conductivity type into a semiconductor body. The first ion implantation causes a defect area (e.g., end-of-range defects) within the semiconductor body at a depth. A non-amorphizing implantation implants dopants of the same conductivity type into the semiconductor body. This ion implantation step implants dopants throughout the defect area. The dopants can then be activated by heating the semiconductor body for significantly less than 10 ms, e.g., using a flash anneal or a laser anneal.

The details of one or more embodiments of the invention are set forth in the accompanying drawings and the description below. Other features and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely the formation of a field effect transistor. The invention may also be applied, however, to other processes that utilize ion implantation. For example, other semiconductor components such as bipolar transistors, capacitors, resistors and diodes can be formed using ion implantation processes.

Figure 1:
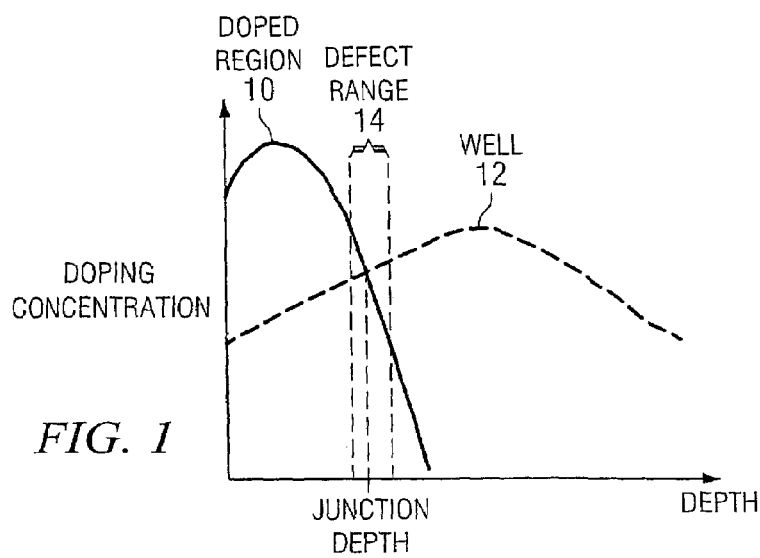
FIG. 1 illustrates a graph that shows a single implant approach of forming a doped region in a semiconductor substrate.

FIG. 1 illustrates a first graph that shows a single implant approach of forming a doped region in a semiconductor substrate. The x-axis provides the depth into the substrate, where the y-axis is drawn at the surface. The doping concentration is shown along the y-axis. The graph of FIG. 1 shows the doping profile 10 of a doped region and also the doping profile 12 of a well region. The junction depth, which is marked on the x-axis, is the depth at which the concentration of the doped region is equal to the concentration of the well region.

In the single implant approach, an amorphizing implant is performed and activated in such a way that the implanted dopants do not diffuse. This implantation causes a band 14 of end-of-range (EoR) defects. As can be seen in the figure, the junction is located in the band and the slope of the doping concentration across the junction is very steep. These factors increase the leakage of a transistor or other device that includes the doped region.

Figure 2:
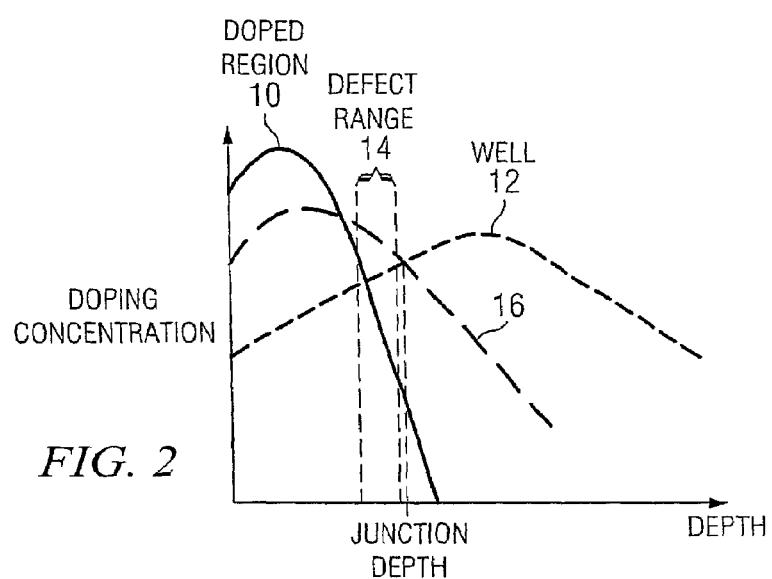
FIG. 2 illustrates a graph that shows a dual implant approach of forming a doped region in a semiconductor substrate.

FIG. 2 illustrates a graph of the doping profile of a doped region manufactured using concepts of the present invention. In this case, a smoothing implant, illustrated by the curve 16, is performed to lower the junction depth beyond the defect band 14. Since the smoothing implant is performed under conditions that will not amorphize the semiconductor, no addition defects will be caused. In addition, the slope of the dopant concentration is smoother. The smoother junction will be less likely to experience band-to-band tunneling and impact ionization. These features will serve to increase the quality of devices manufactured using this technique.

It is noted that in the graph of FIG. 2, the junction depth is illustrated as being the point at which the smoothing implant curve 16 crosses the well curve 12. It is acknowledged that this is an estimate since the sum of the doped region (curve 10) dopants and the smoothing implant (curve 16) dopants, as well as any other dopants, should be considered. Given the low value of the doped region concentration at the point noted as the junction depth, this estimate should not change the result significantly.

FIGS. 3-6 illustrate one device that can benefit from aspects of the present invention. In particular, the formation of a field effect transistor with very shallow source/drain junctions will be illustrated. It is understood that various aspects of the present invention can also be utilized with other semiconductor components.

Figure 3:
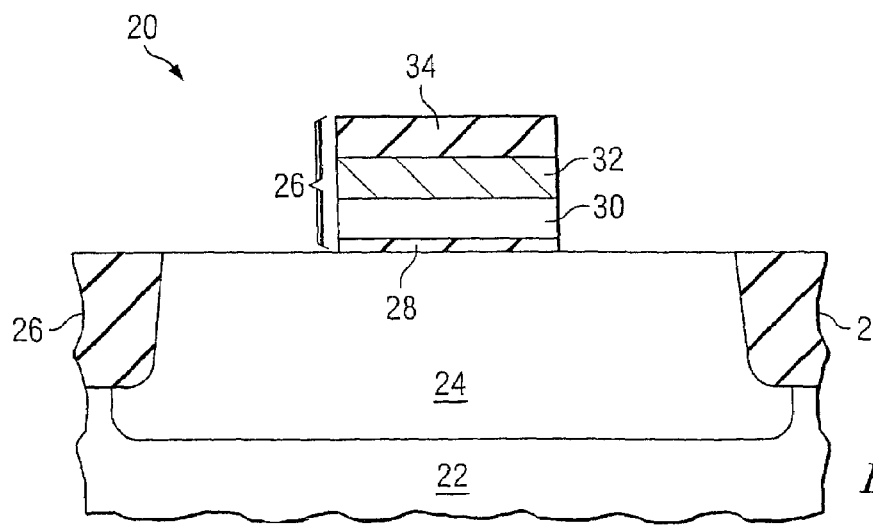
FIGS. 3-6 illustrate various stages during the fabrication of a transistor device.

FIG. 3 illustrates a partially formed transistor 20. The transistor 20 is formed in a semiconductor body 22. The semiconductor body 22 may comprise a bulk semiconductor substrate, a layer (e.g., an epitaxial layer) overlying a substrate, or a region formed within a substrate or a layer. As an example, concepts of the present invention are very well suited for silicon-on-insulator applications where transistors are formed in a layer of semiconductor material that overlies an insulating layer (e.g., a buried oxide). The preferred semiconductor material is silicon. It is understood, however, that devices formed in other elemental semiconductors (e.g., germanium), alloy semiconductors (e.g., silicon germanium) or compound semiconductors (e.g., gallium arsenide) can also benefit from aspects of the present invention.

In the illustrated embodiment, the transistor is formed in an active area defined by isolation regions 26. In the preferred embodiment, the isolation regions are shallow trench isolation (STI) regions. In other embodiments, the isolation can be provided using other techniques such as field isolation or deep trench isolation. In the preferred embodiment, the STI regions 26 extend about 1000 nm or less into the semiconductor body 22. As an example, in some technologies, such as ultra thin SOI as an example, this number may be significantly less than 1000 nm.

A well region 24 is formed in the active area. In an exemplary embodiment, the semiconductor body can be a p-doped substrate. In this case, p-channel transistors would be formed in an n-well 24. In the example of a p-doped substrate, the n-channel transistors can be formed in the substrate (without a well) or, more preferably, in a p-well 24 formed in the substrate. In other embodiments, an n-doped semiconductor body 22 can be used with p-wells and optional n-wells. The well region 24 typically extends to a depth of about 1000 nm to about 3000 nm.

A gate stack 26 overlies the semiconductor body. In the exemplary embodiment, the gate stack includes a gate dielectric 28, a composite layer gate conductor 30/32 and a hard mask 34. To form the gate stack, the gate dielectric layer is deposited. A gate conductor layer is deposited over the gate dielectric layer and a hard mask layer is deposited over the gate conductor layer. A photoresist layer (not shown) is formed over the hard mask layer and, using photolithography techniques, is patterned to cover the gate stack. The hard mask layer, which may be silicon nitride, can then be etched to form the hard mask 34. Using the hard mask 34 as a mask, the other layers 32, 30 and possibly 28 are etched to create the desired gate structure.

The gate dielectric layer can be an oxide layer such as silicon dioxide, a nitride layer such as silicon nitride ($Si_3N_4$), or a combination of oxide and nitride such as silicon oxynitride or multiple layers of oxides and nitrides. In other embodiments, the gate dielectric 28 can be a high-k dielectric (i.e., a dielectric with a dielectric constant greater than the dielectric constant of $Si_3N_4$). Examples of high-k dielectrics that can be used as a gate dielectric include $HfO_2$, (nitrided) Hf silicate, $Al_2O_3$, $ZrO_2$, Zr—Al—O, and Zr silicate.

In FIG. 3, the gate conductor is illustrated as including two layers. For example a silicide layer 32 can overlie a polysilicon layer 30. When a polysilicon gate 30 is used, it is often desirable to further include a metal to lower the resistance of the region. Examples of silicides that can be used for layer 32 include titanium silicide, tungsten silicide, cobalt silicide, platinum silicide and nickel silicide. In other embodiments, a metal gate can be used (e.g., a single or multiple layers of metal). The metal gate can be a metal (e.g., Ir, Ru, RuTa, Ti, Mo), metal silicide (e.g., a fully silicided gate), metal nitride (e.g., HfN, TiN, TaSiN) or other.

As discussed above, aspects of the present invention are particularly useful in very small technologies, which have shallow junctions and dopants with little diffusion. In particular, the present invention can be applied to process nodes of less than 90 nm, e.g., when the gate lengths are 60 nm and below. The methodology can also be retrofitted in previous generations.

Figure 4:
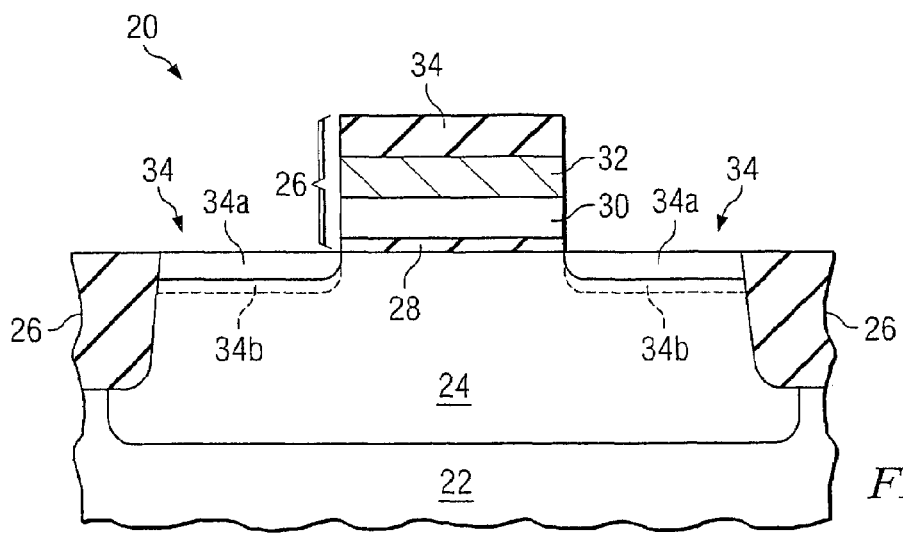

Referring now to FIG. 4, lightly doped source and drain regions are formed. In the illustrated embodiment, the lightly doped source and drain regions, sometimes referred to as extension regions, are formed using at least two implantation steps as described above with respect to FIG. 2. In some embodiments, additional implantation steps can be performed, e.g., for counterdoping (e.g., halo), which will increase the number of implants. In other embodiments, a single implantation step can be performed. It is desirable that the extension regions 34 and/or the source/drain regions 36 (FIG. 6) be formed with two non-diffusing implantations.

FIG. 4 shows that the extension regions 34 include a higher doped region 34a that was formed by performing an amorphizing implant and a lower doped region 34b that extends beyond the higher doped region 34a and was formed by performing a non-amorphizing implant. The doping concentrations of the regions 34a and 34b are illustrated by curves 10 and 16, respectively, in FIG. 2. In the preferred embodiment, the amorphizing ion implantation step is performed at a dose that is higher than the dose of the non-amorphizing implant and at an implant energy that is less than the implant energy of the non-amorphizing implant, assuming that the same dopants are used for both steps. In this manner, the first ion implantation causes an end-of-range defect area in the semiconductor body and the second ion implantation implants dopants throughout the end-of-range defect area. Depending on the species (e.g., how heavy the ions are) the relationship between the energies and doses of the two steps may vary. The above relation is correct for the case when the same species is used, which is not necessarily the case.

In the preferred embodiment, the smoothing implant is performed after the doped region implant. This order of steps, however, is not required. In an alternate embodiment, the smoothing implantation can be performed first. The smoothing implant and doped region implant can be performed using the same species (e.g., boron, arsenic or phosphorus for both) or using different species (e.g., arsenic for one and phosphorus for the other). In addition, it is understood that other implantations, e.g., co-implants, can be performed. For example, the implantation of species such as carbon, fluorine, or germanium maximum can be performed to impact the activation of dopants (or for other reasons).

After the two implantations, the dopants can be activated, preferably by heating the semiconductor body for a time such that the dopants substantially do not diffuse. In one example, the semiconductor body 22 is heated for a time of less than 10 ms. In order to activate the ions in such a short time, very high temperatures, e.g., between about 1200° C. and about 1300° C. are achieved. Even melting anneals are possible.

Two examples of annealing techniques that can be used to meet these requirements are a flash anneal and a laser anneal. In a flash anneal process, a very short light pulse is generated by a bank of intense light source and is emitted toward the wafer for a time period of milliseconds. In a laser anneal process, a laser beam scans the wafer heating portions that are being scanned. This process also occurs for a time period of milliseconds. In comparison, a less preferred method is a rapid thermal anneal (RTA), which typically heats the wafer for a time period measured in seconds and, as a result, will cause some diffusion of the dopants.

Figure 5:
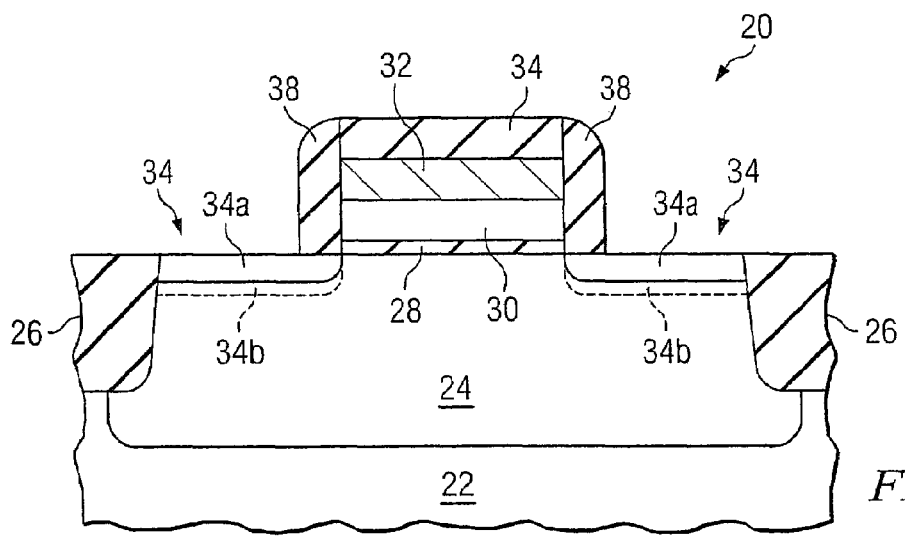

Referring next to FIG. 5, sidewall spacers 38 are formed along sidewalls of the gate stack 26. The sidewall spacers 38 can be formed by depositing a conformal layer of dielectric, such as silicon oxide or silicon nitride, and anisotropically etching the conformal layer to leave the spacers 38 along the sidewall. The simplified view of FIG. 5 shows only a single spacer. It is understood, however, that this process can be repeated more than once to get a spacer of the desired thickness. If multiple spacers are used, additional extension implants could be performed.

Figure 6:
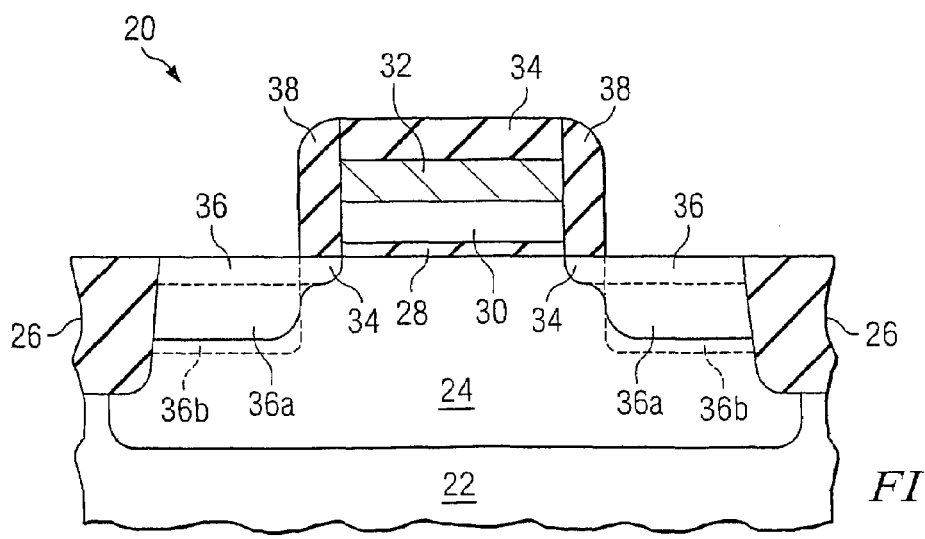

FIG. 6 illustrates the formation of the source and drain region 36. Once again, these regions are preferably formed using the two-implantation step (or more) described above. The relative relationships of the doping concentrations from each of the two implants is shown in FIG. 2. In the case of a 45 nm node transistor, the two implantations will preferably form a doped region with a junction depth of about 50 nm to about 70 nm. This dimension can vary with other technology nodes.

Once again, the dopants can be activated by heating the semiconductor body for a time such that the dopants substantially do not diffuse. As before, two preferred methods of annealing are laser anneal and flash anneal. If desired, the dopants from the source/drain regions 36 can be activated at the same time as the dopants from the extension regions 34.

It is noted that the ranges of energy, doses and other implant conditions will vary depending upon the species of dopants used, the geometries of the device being fabricated and other conditions. In one exemplary embodiment, arsenic ion can be implanted to create an n-doped extension region. In this example, the arsenic dose is between about $5\times10^{14}$ cm$^{-2}$ and about $5\times10^{15}$ cm$^{-2}$ for the amorphizing implant and between about $10^{13}$ cm$^{-2}$ and about $10^{14}$ cm$^{-2}$ for the non-amorphizing implant. The first implant energy for the amorphizing implant is between about 1 keV and about 5 keV and for the non-amorphizing implant is between about 1.5 keV and about 8 keV. In other embodiments, the ratio of the first dose to the second dose is between 5 and 15 and the ratio of the first implant energy to the second implant energy is between 1.5 and 5.

Figure 7:
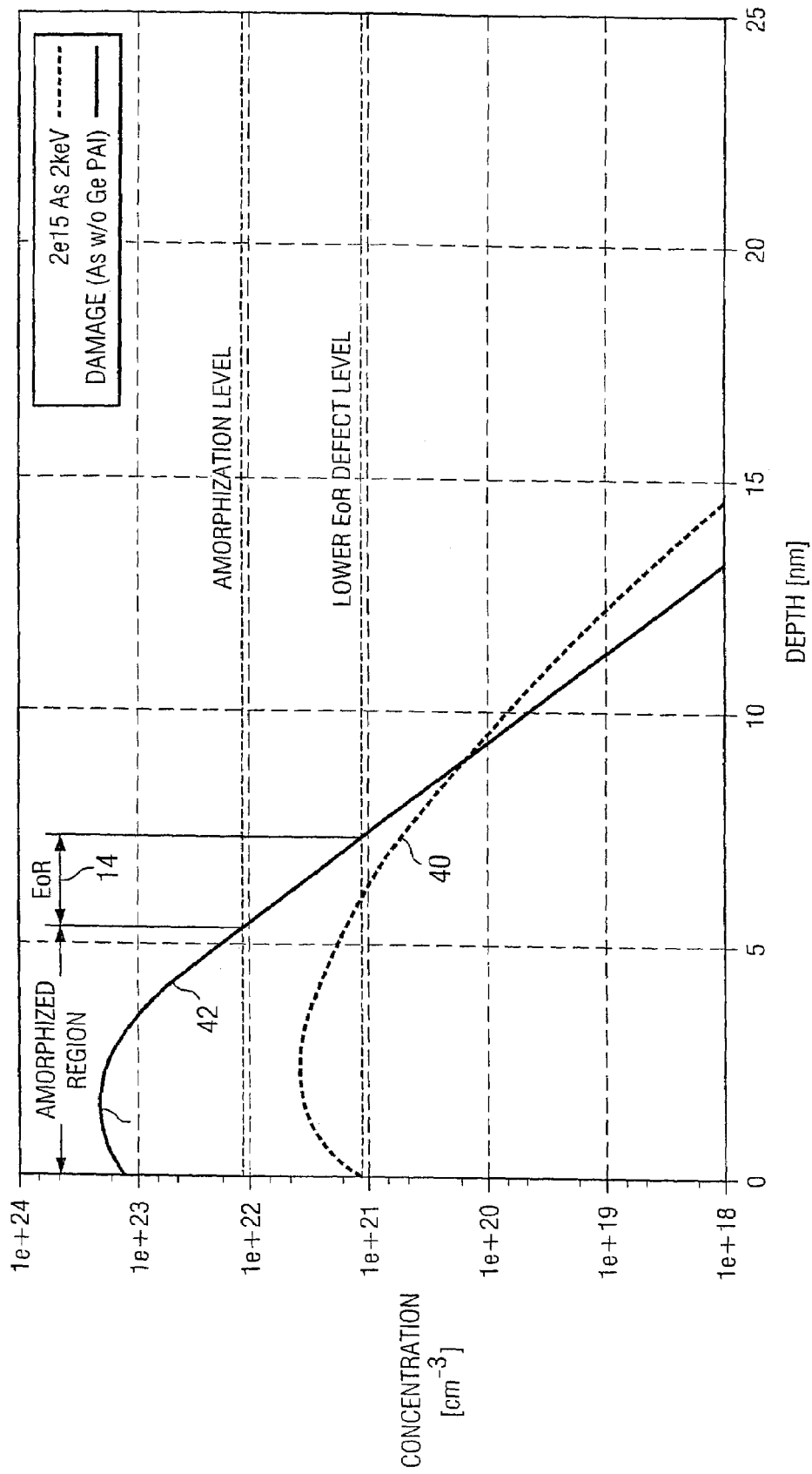
FIGS. 7 and 8 illustrate simulations for one exemplary embodiment.
Figure 8:
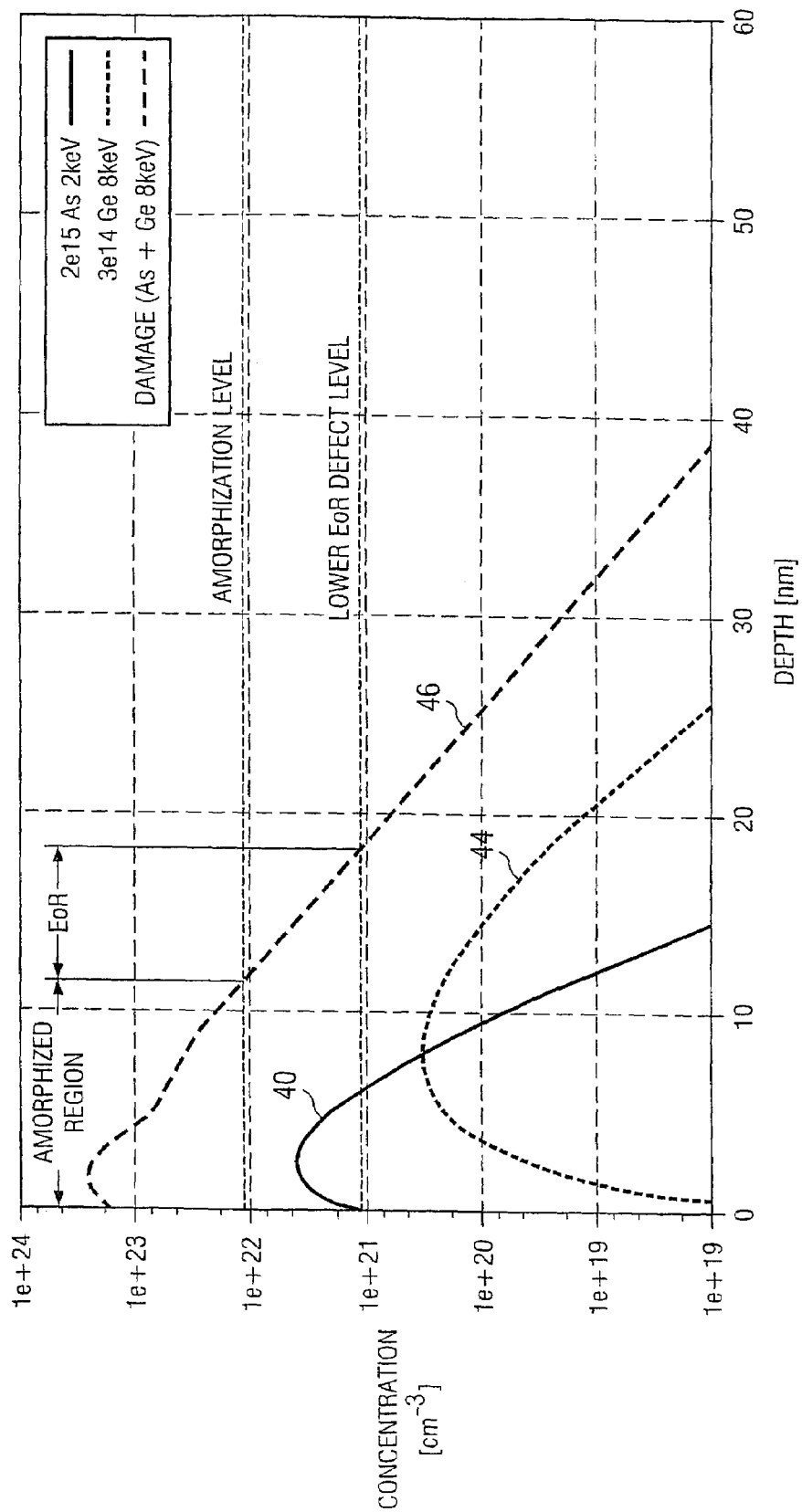

To provide examples that illustrate the principles of embodiments of the invention, FIGS. 7 and 8 illustrate the doping concentrations for a simulation performed for an extension region with and without a premorphization Ge implant.

Referring first to FIG. 7, an implant of arsenic was made at a dose of $2\times10^5$ cm$^{-2}$ and an energy of 2 keV. The resulting concentration is shown in curve 40. The resulting effects of amorphization are illustrated by curve 42. In particular, it is observed that the lattice structure of the silicon is amorphized when the simulated curve 42 shows a concentration above about $10^{22}$ cm$^{-3}$. The end of range is found to be at depths where the concentration is between about $10^{21}$ cm$^{-3}$ and about $10^{22}$ cm$^{-3}$ and the lattice is intact where the concentration is below about $10^{21}$ cm$^{-3}$. The graph illustrates the EoR band 14, which begins at a depth of about 5.5 nm and extends for a depth of about 2 nm. The goal of the softening implant would then be to move the junction depth beyond the end of this range.

FIG. 8 provides a similar example. In this case, arsenic is once again implanted at a dose of $2\times10^{15}$ cm$^{-2}$ and an energy of 2 keV. In addition, a premorphization implant of Ge was made at a dose of $3\times10^{14}$ cm$^{-2}$ and an energy of 8 keV. The resulting concentration is shown by curve 44. The resulting EoR region 14 can then be determined from the simulated curve 46. As shown in the curve, the premorphization implant causes the EoR region 14 to be shifted down to a depth of about 12 nm and extend an additional 6.5 nm into the semiconductor. Once again, the goal of the softening implant would then be to move the junction depth beyond the end of this range.

Aspects of the invention have been described with respect to a field effect transistor. One of ordinary skill in the art will readily see that the concepts could be applied to other devices. For example, non-volatile memory cells, such as floating gate, NROM, SONOS, DRAM, MRAM, FeRAM cells, also utilize doped regions that could be formed using concepts of the present invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a semiconductor device, the method comprising:
  providing a semiconductor body;
  performing an amorphizing ion implantation to implant dopants of a first conductivity type into the semiconductor body, the amorphizing ion implantation causing a defect area within the semiconductor body at a depth;
  performing a non-amorphizing implantation to implant dopants of the first conductivity type into the semiconductor body, the non-amorphizing ion implantation implanting dopants throughout the defect area; and
  activating the dopants by heating the semiconductor body for less than 10 ms.

2. The method of claim 1, wherein performing the amorphizing implant and performing the non-amorphizing implant comprises forming a source/drain region of a transistor.

3. The method of claim 1, wherein activating the dopants comprises performing a flash anneal.

4. The method of claim 1, wherein activating the dopants comprises performing a laser anneal.

5. The method of claim 1, wherein the amorphizing and non-amorphizing implantations form a doped region with a junction depth of less than or equal to about 80 nm.

6. The method of claim 1, wherein activating the dopants comprises heating the semiconductor body in a manner such that the dopants substantially do not diffuse within the semiconductor body.

7. The method of claim 1, wherein the amorphizing ion implantation implants a first species of dopants and the non-amorphizing ion implantation implants a second species of dopants.

8. The method of claim 1, further comprising performing, the co-implantation of the co-implantation implanting dopants that are different than the dopants of the first ion implantation and the dopants of the second ion implantation.

9. The method of claim 1, wherein the first implantation is an amorphizing implant and wherein the second implant is a non-amorphizing implant.

10. A method of forming a transistor, the method comprising:
   providing a semiconductor body of a first conductivity type;
   forming a gate stack over the semiconductor body, the gate stack including a gate conductor overlying a gate dielectric, the gate conductor having a gate length of less than 60 nm; and
   implanting source and drain regions of a second conductivity type into the semiconductor body adjacent edges of the gate stack, the implanting comprising performing a first ion implantation at a first dose and a first implant energy, performing a second ion implantation at a second dose and a second implant energy, the first ion implantation step causing a defect area in the semiconductor body and the second ion implantation step causing dopants of the second conductivity type to extend across the defect area, wherein a concentration of dopants of the second conductivity type is greater than a concentration of dopants of the first conductivity type in the defect area; and
   activating the dopants by heating the semiconductor body for less than 10 ms.

11. The method of claim 10, further comprising forming sidewall spacers along sidewalls of the gate stack, wherein said implanting of source and drain regions is performed after forming the sidewall spacers.

12. The method of claim 10, further comprising forming sidewall spacers along sidewalls of the gate stack, wherein said implanting of source and drain regions is performed before forming the sidewall spacers.

13. The method of claim 10, wherein implanting source and drain regions comprises implanting lightly doped source and drain regions, the method further comprising:
   after implanting the lightly doped source and drain regions, forming sidewall spacers along sidewalls of the gate stack; and
   implanting heavily doped source and drain regions of the second conductivity type into the semiconductor body adjacent the sidewall spacers, the implanting comprising performing a first ion implantation at a first dose and a first implant energy, performing a second ion implantation at a second dose and a second implant energy, and activating the dopants by heating the semiconductor body for less than 10 ms.

14. The method of claim 10, wherein activating the dopants comprises performing a flash anneal.

15. The method of claim 10, wherein activating the dopants comprises performing a laser anneal.

16. The method of claim 10, wherein the first and second implantations form a doped region with a junction depth of less than or equal to about 80 nm.

17. The method of claim 10, wherein the second dose is lower than the first dose and the second implant energy is higher than the first implant energy.

* * * * *

UNITED STATES PATENT AND TRADEMARK OFFICE
CERTIFICATE OF CORRECTION

| | |
|---|---|
| PATENT NO. | : 7,358,167 B2 |
| APPLICATION NO. | : 11/600424 |
| DATED | : April 15, 2008 |
| INVENTOR(S) | : Hierlemann |

It is certified that error appears in the above-identified patent and that said Letters Patent is hereby corrected as shown below:

In the drawings, Sheet 4, Fig. 8, on the lower left corner on the y axis, bottom solid line of chart, delete lower "1e + 19" and insert --1e + 18--.

Signed and Sealed this

Eighth Day of July, 2008

JON W. DUDAS
*Director of the United States Patent and Trademark Office*